United States Patent
Kats et al.

(10) Patent No.: US 8,378,281 B2
(45) Date of Patent: Feb. 19, 2013

(54) TERRESTRIAL SOLAR TRACKING PHOTOVOLTAIC ARRAY WITH OFFSET SOLAR CELL MODULES

(75) Inventors: Mikhail Kats, Rockaway, NJ (US); Gary Hering, Belle Mead, NJ (US)

(73) Assignee: Suncore Photovoltaics, Inc., Irwindale, CA (US)

( * ) Notice: Subject to any disclaimer, the term of this patent is extended or adjusted under 35 U.S.C. 154(b) by 570 days.

(21) Appl. No.: 12/623,134

(22) Filed: Nov. 20, 2009

(65) Prior Publication Data

US 2010/0101632 A1      Apr. 29, 2010

Related U.S. Application Data

(63) Continuation-in-part of application No. 12/574,508, filed on Oct. 6, 2009, which is a continuation-in-part of application No. 12/478,567, filed on Jun. 4, 2009, now Pat. No. 8,188,415, which is a continuation-in-part of application No. 12/257,670, filed on Oct. 24, 2008, now Pat. No. 8,188,413.

(51) Int. Cl.
  *G01C 21/02* (2006.01)
  *H02N 6/00* (2006.01)
  *A47G 23/04* (2006.01)

(52) U.S. Cl. .................... 250/203.4; 136/246; 126/605

(58) Field of Classification Search ............... 250/203.4, 250/203.1, 203.3; 126/576, 605, 684; 136/246, 136/251, 259
See application file for complete search history.

(56) References Cited

U.S. PATENT DOCUMENTS

| | | | |
|---|---|---|---|
| 4,031,385 A | 6/1977 | Zerlaut et al. | |
| 4,172,739 A | 10/1979 | Tassen | |
| 4,345,582 A | 8/1982 | Aharon | |
| 4,425,904 A | 1/1984 | Butler | |
| 4,440,465 A | 4/1984 | Elliott et al. | |
| 4,585,318 A | 4/1986 | Seifert | |
| 4,586,488 A | 5/1986 | Noto | |
| 4,628,142 A | 12/1986 | Hashizume | |
| 4,832,001 A | 5/1989 | Baer | |
| 4,888,340 A | 12/1989 | Neh et al. | |
| 4,989,124 A | 1/1991 | Shappell | |

(Continued)

FOREIGN PATENT DOCUMENTS

| DE | 10 2004 018151 A1 | 10/2005 |
|---|---|---|
| DE | 20 2006 003476 U1 | 12/2006 |

(Continued)

OTHER PUBLICATIONS

"Concentrating PV module and system developers." Photon International: The Photovoltaic Magazine. Aug. 2009. pp. 134-137. Photon Europe GmbH, Aachen, Germany.

(Continued)

*Primary Examiner* — Georgia Y Epps
*Assistant Examiner* — Don Williams
(74) *Attorney, Agent, or Firm* — Mueting, Raasch & Gebhardt, P.A.

(57) ABSTRACT

Terrestrial solar tracking photovoltaic arrays that may include a modular design that is sized and weighted to facilitate installation with a small amount of manpower. The array may further be adapted to be adjusted during or after installation to accommodate the necessary power requirements. The terrestrial solar tracking photovoltaic array may include a torque tube that may be constructed of discrete sections. A drive may be connected to the torque tube to rotate the torque tube. A number of solar cell modules may be connected to the torque tube. The modules may be positioned at offsetting angular orientations depending upon their distance away from the drive. This offset positioning compensates for twisting distortion of the torque tube caused by the drive rotating the torque tube. At one point of rotation, each of the solar cell modules may be substantially aligned in a common plane.

22 Claims, 9 Drawing Sheets

U.S. PATENT DOCUMENTS

| | | | |
|---|---|---|---|
| 4,995,377 | A | 2/1991 | Eiden |
| 5,169,456 | A | 12/1992 | Johnson |
| 5,600,124 | A | 2/1997 | Berger |
| 5,798,517 | A | 8/1998 | Berger |
| 6,058,930 | A | 5/2000 | Shingleton |
| 6,079,408 | A | 6/2000 | Fukuda |
| 6,123,067 | A | 9/2000 | Warrick |
| 6,465,725 | B1 | 10/2002 | Shibata et al. |
| 6,552,257 | B1 | 4/2003 | Hart et al. |
| 6,563,040 | B2 | 5/2003 | Hayden et al. |
| 6,722,357 | B2 | 4/2004 | Shingleton |
| 6,960,717 | B2 | 11/2005 | Stuart et al. |
| 7,252,084 | B2 | 8/2007 | Pawlenko et al. |
| 7,381,886 | B1 | 6/2008 | Aiken et al. |
| 7,531,741 | B1 * | 5/2009 | Melton et al. ............ 136/246 |
| 7,795,568 | B2 | 9/2010 | Sherman |
| 7,836,879 | B2 * | 11/2010 | Mackamul ............ 126/600 |
| 2004/0112373 | A1 | 6/2004 | Djeu |
| 2007/0089777 | A1 | 4/2007 | Johnson, Jr. et al. |
| 2007/0101738 | A1 | 5/2007 | Akei et al. |
| 2007/0188876 | A1 | 8/2007 | Hines et al. |
| 2007/0193620 | A1 | 8/2007 | Hines et al. |
| 2008/0128586 | A1 | 6/2008 | Johnson et al. |
| 2008/0135087 | A1 | 6/2008 | Anikara |
| 2008/0178867 | A1 | 7/2008 | DiDomenico |
| 2008/0236567 | A1 | 10/2008 | Hayden |
| 2008/0258051 | A1 | 10/2008 | Heredia et al. |
| 2009/0000662 | A1 | 1/2009 | Harwood et al. |
| 2009/0032014 | A1 | 2/2009 | Meydbray |
| 2009/0032084 | A1 | 2/2009 | Aiken et al. |
| 2009/0032086 | A1 | 2/2009 | Kats et al. |
| 2009/0032090 | A1 | 2/2009 | Kats et al. |
| 2009/0199890 | A1 * | 8/2009 | Hering et al. ............ 136/246 |
| 2010/0011565 | A1 | 1/2010 | Zawadzki et al. |
| 2010/0018570 | A1 | 1/2010 | Cashion et al. |
| 2010/0032004 | A1 | 2/2010 | Baker et al. |
| 2010/0101625 | A1 | 4/2010 | Kats et al. |
| 2010/0101630 | A1 | 4/2010 | Kats et al. |
| 2010/0102200 | A1 | 4/2010 | Kats et al. |
| 2010/0102202 | A1 | 4/2010 | Sherman |
| 2010/0108860 | A1 | 5/2010 | Sherman et al. |
| 2010/0258110 | A1 | 10/2010 | Krabbe et al. |
| 2010/0294337 | A1 | 11/2010 | Sherman et al. |

FOREIGN PATENT DOCUMENTS

| | | | |
|---|---|---|---|
| ES | 2268938 | A1 | 3/2007 |
| JP | 2000196127 | | 7/2000 |
| JP | 2000223730 | | 8/2000 |
| JP | 2002202817 | | 7/2002 |
| WO | WO 0155651 | A1 | 8/2001 |
| WO | WO 02079793 | | 10/2002 |
| WO | WO 2008/008023 | A1 | 1/2008 |
| WO | WO 2008/090241 | A1 | 7/2008 |
| WO | WO 2008/154945 | | 12/2008 |
| WO | WO 2009/048879 | | 4/2009 |

OTHER PUBLICATIONS

"WS T 1600—the world wide connected solar tracker." Data Sheet, 2 pages. www.ws-energia.com. WS Energia Lda, Oeiras, Portugal.

"WS T 1600—the world wide connected solar tracker." Data Sheet, 3 pages. www.ws-energia.com. WS Energia Lda, Oeiras, Portugal.

"WS T1000." Data Sheet, 2 pages. www.ws-energia.com. WS Energia Lda, Oeiras, Portugal.

"170 Watt NE-170UC1." Data Sheet, 2 pages. Sharp.co.jp. Sharp Electronics Corp., Huntington Beach, CA.

"OPEL SF-4M Roof Top Tracker." Data Sheet, 2 pages. www.opelinc.com. OPEL Solar Inc. Shelton, CT.

"FEiNA SF-4 Mini Tracker." Data Sheet, 2 pages. www.opelinc.com. OPEL Solar Inc. Shelton, CT.

"SF-40 H1 Rooftop Tracker." Data Sheet, 2 pages. www.opelinc.com. OPEL Solar Inc. Shelton, CT.

"OPEL TF-800 Single Axis Tracker." Data Sheet, 2 pages. www.opelinc.com. OPEL Solar Inc. Shelton, CT.

"FEiNA SF-9 Dual Axis Tracker." Data Sheet, 2 pages. www.opelinc.com. OPEL Solar Inc. Shelton, CT.

"FEiNA SF-20 Dual Axis Tracker." Data Sheet, 2 pages. www.opelinc.com. OPEL Solar Inc. Shelton, CT.

"OPEL SF-20 CPV Dual Axis Tracker." Data Sheet, 2 pages. www.opelinc.com. OPEL Solar Inc. Shelton, CT.

"TF-500 Dual Axis Tracker." Data Sheet, 2 pages. www.opelinc.com. OPEL Solar Inc. Shelton, CT.

"Mk-Id High Concentration Photovoltaic Panel (HCPV)." Data Sheet, 2 pages. www.opelinc.com. OPEL Solar Inc. Shelton, CT.

"PS140 Solar Concentrator." Data Sheet, 2 pages. www.power-spar.com. Power-Spar, Markham, Ontario, Canada.

Fraas, L., et al., "Start-Up of First 100 kW System in Shanghai with 3-Sun PV Mirror Modules." 4 pages. Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA.

Fraas, L., et al., "Test Sites and Testing of 3-Sun Mirror Modules." 4 pages. Presented at IEE 4th World Conference on Photovoltaic Energy Conversion, Waikoloa, Hawaii, May 9, 2006. Jxcrystals.com JX Crystals, Inc., Issaquah, WA.

"SunCube Specifications." Data Sheet, 4 pages. www.greenandgoldenergy.com.au. Green and Gold Energy Pty. Ltd., Glynde, Australia.

"Sunflower Fully-Integrated, Smart HCPV." Data Sheet, 2 pages. www.energyinnovations.com. Energy Innovations, Poway, CA.

"Kinematics slewing drives" Product description. 1 page. www.kinematicsmfg.com/Products/slewing-drives.aspx. Kinematics Manufacturing, Inc. Phoenix, AZ.

"Slewing Drives S7b-73m-32ra." Data Sheet, 2 pages. www.kinematicsmfg.com/Products/slewing-drives/SlewingDrivesProducts/Slewing-Drives-S7B-73M-32RA.aspx. Kinematics Manufacturing, Inc. Phoenix, AZ.

Picture of GE Concentrator Array, Circa 1983, Sandia.

"170 Watt Multi-Purpose Module NEC 2008 Compliant, NE-170UC1" datasheet. Sharp Electronics Corporation, Huntington, CA, 2008; 2 pgs.

"Concentrating PV module and system developers[#5]" PHOTON International: The Photovoltaic Magazine, Photon Europe GmbH, Germany, Aug. 2009; pp. 134-137.

"FEiNA SF-4 Mini Tracker" datasheet. OPEL Solar™ Inc., www.opelinc.com, Shelton, CT, Nov. 2009; 2 pgs.

"FEiNA SF-9 Dual Axis Tracker" datasheet. OPEL Solar™ Inc., www.opelinc.com, Shelton, CT, Nov. 2009; 2 pgs.

"FEiNA SF-20 Dual Axis Tracker" datasheet. OPEL Solar™ Inc., www.opelinc.com, Shelton, CT, Nov. 2009; 2 pgs.

Fraas et al., "Start-up of First 100 kW System in Shanghai with 3-Sun PV Mirror Modules," Presented at 4th International Conference on Solar Concentrators for the Generation of Electricity or Hydrogen (ICSC-4), San Lorenzo del Escorial, Spain, Mar. 12-16, 2007. Jxcrystals.com. JX Crystals, Inc., Issaquah, WA; 4 pgs.

Fraas et al., "Test Sites and Testing of 3-Sun Mirror Modules," Presented at IEE 4th World Conference on Photovoltaic energy Conversion, Waikoloa, Hawaii, May 9, 2006, Jxcrystals.com. JX Crystals, Inc., Issaquah, WA; 4 pgs.

"GLOBO-welding, Laser welding of plastics—innovative and flexible. The universal processing concept for 3D and continuous applications," Brochure datasheet. http://www.leister.com/uploads/pdf/en/BRO_GLOBO_Welding_dv092006_Eng.pdf Leister Process Technologies, LLC, Sarnen, Switzerland, Sep. 2009; 4 pgs.

"Kinematics slewing drives," Product description datasheet [online]. Kinematics Manufacturing, Inc., Phoenix, AZ, 2009, available online [retrieved on Jul. 8, 2009]. Retrieved from the Internet:<URL:www.kinematicsmfg.com/Products/slewing-drives.aspx>; 1 page.

"Laser welding of plastics. Innovative and flexible." Brochure. http://www.leister.com/uploads/pdf/en/leister_laser_eng.pdf, Leister Process Technologies, LLC, Sarnen, Switzerland, Sep. 2006; 12 pgs.

Luque et al., Ed. Sections 9.8 and 9.9 "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, 2003; 64 pgs. ISBN1591247748. Ebook accessed through North Carolina State University Libraries. http://catalog.lib.ncsu.edu.web2/tramp2.exe/goto/A1h11rgi.002?screen=Record.Html&server=1home&item=3.

"Mk-ID High Concentration Photovoltaic Panel (HCPV)" datasheet. OPEL Solar™ Inc., www.opelinc.com, Shelton, CT, Nov. 2009; 2 pgs.

"OPEL SF-4M Roof Top Tracker" datasheet. OPEL Solar™ Inc., www.opelinc.com, Shelton, CT, Nov. 2009; 2 pgs.

"OPEL SF-20 CPV Dual Axis Tracker" datasheet. OPEL Solar™ Inc., www.opelinc.com, Shelton, CT, Nov. 2009; 2 pgs.

"OPEL TF-800 Single Axis Tracker" datasheet. OPEL Solar™ Inc., www.opelinc.com, Shelton, CT, Nov. 2009; 2 pgs.

Photograph of GE Concentrator Array, Circa 1983, Sandia; 1 page.

"Power-Spar PS-140 Solar Concentrator," datasheet. Menova Energy, Inc., Markham, Ontario, Canada, 2009; 2 pgs.

"SF-40 H1 Rooftop Tracker" datasheet. OPEL Solar™ Inc., www.opelinc.com, Shelton, CT, Nov. 2009; 2 pgs.

"Shop SABRE, a N.A.S.C.I. Company, 'The Way CNC Was Meant to Be'" Laser Product Information datasheet. Shop SABRE, Elko, MN, USA, 2007, available online [retrieved on Jun. 26, 2008]. Retrieved from the Internet:<URL:http://www.shopsabre.com/Laser%20Page.html>; 4 pgs.

"Slewing Drives S7b-73m-32ra," datasheet [online]. Kinematics Manufacturing, Inc., Phoenix, AZ, 2009, available online [retrieved on Jul. 8, 2009]. Retrieved from the Internet:<URL: www.kinematicsmfg.com/Products/slewing-drives/SlewingDrivesProducts/Slewing-Drives-S7B-73M-32RA.aspx>; 2 pgs.

"SunCube™ Specifications" datasheet. Green & Gold Energy Pty, Ltd., Glynde, South Australia, Australia, 2009; 4 pgs.

"Sunflower" datasheet. Energy Innovations, Poway, CA, copyright 2003-2010; 2 pgs.

"TF-500 Dual Axis Tracker" datasheet. OPEL Solar™ Inc., www.opelinc.com, Shelton, CT, Nov. 2009; 2 pgs.

"WS T1000" datasheet [online]. WS Energia Lda, Oeiras, Portugal, 2010, available online. Retrieved from the Internet:<URL: http://www.ws-energia.com/np4EN/trackers>; 2 pgs.

"WS T 1600—the world wide connected solar tracker" datasheet [online] WS Energia Lda, Oeiras, Portugal, 2010, available online. Retrieved from the Internet:<URL: http://www.ws-energia.com/np4EN/trackers>; 3 pgs.

"WS T 1600—the world wide connected solar tracker" datasheet [online] WS Energia Lda, Oeiras, Portugal, 2010, available online. Retrieved from the Internet:<URL: http://www.ws-energia.com/np4EN/trackers>; 2 pgs.

U.S. Appl. No. 12/791,580, filed Jun. 1, 2010, Kats et al.

U.S. Appl. No. 12/828,734, filed Jul. 1, 2010, Kozin.

U.S. Appl. No. 12/830,926, filed Jul. 6, 2010, Sherman.

Luque, A. and Hegedus, S., eds. Handbook of Photovoltaic Science and Engineering. Wiley: Hoboken, NJ. 2003. Sections 9.8 and 9.9 and Chapter 11. 64 pages total. ISBN 1591247748. Ebook accessed through North Carolina State University Libraries. http://catalog.lib.ncsu.edu/web2/tramp2.exe/goto/A1hl1rgj.002?screen=Record.html&server=1home&item=.

"Laser welding of plastics. Innovative and flexible." Brochure. http://www.leister.com/uploads/pdf/en/leister_laser_eng.pdf. Sep. 2007. Leister Process Technologies. Kaegiswil, Switzerland. (12 pages).

"GLOBO-welding. Laser welding of plastics—innovative and flexible. The universal processing concept for 3D and continuous applications." Brochure. http://www.leister.com/uploads/pdf/en/BRO_GLOBO_Welding_dv092006_ENG.pdf. Sep. 2006. Leister Process Technologies. Kaegiswil, Switzerland. (4 pages).

"Shop SABRE, a N.A.C.S.I Company. 'The Way CNC Was Meant to Be.'" Laser Product Information. http://www.shopsabre.com/Laser%20Page.html. No date of web publication given. Shop SABRE. Elko, Minnesota, USA. (4 pages).

* cited by examiner

TERRESTRIAL SOLAR TRACKING PHOTOVOLTAIC ARRAY WITH OFFSET SOLAR CELL MODULES

RELATED APPLICATION

The present application is a continuation-in-part of U.S. patent application Ser. No. 12/574,508 filed Oct. 6, 2009 which is a continuation-in-part of U.S. patent application Ser. No. 12/478,567 filed Jun. 4, 2009 which itself is a continuation-in-part of U.S. patent application Ser. No. 12/257,670 filed Oct. 24, 2008. Each of these references is herein incorporated by reference in their entirety.

BACKGROUND

The present application is directed to a terrestrial solar tracking photovoltaic array and, more particularly, to a modular array with solar cell modules that are simultaneously movable about first and second orthogonal axes to maintain the solar cell modules aligned with the sun.

Terrestrial solar tracking photovoltaic arrays are used for various applications. The arrays are designed for a specific output capacity and cannot be modified in a convenient manner for different capacities. The set capacity of the arrays may vary from being relatively small, such as a few kilowatts, to relatively large in excess of hundreds of kilowatts. The arrays may be installed at various locations that have exposure to the sun for adequate periods of time to produce the required power capacity.

The photovoltaic arrays generally include a frame with one or more solar cell modules in the form of panels. The frame may be adjustable to position the solar cell modules towards the sun. The frame may adjust the position of the solar cell modules throughout the day to ensure they remain directed to the sun to maximize the power capacity.

Many existing photovoltaic arrays include large frames that support the solar cell modules. The size of the frames and installation requirements often result in their costs being substantial. Initially, the frames are moved by large trucks or other like equipment to the installation site. Cranes or other like lifting equipment are necessary to lift the frames from the trucks and position them at the correct location. This installation process often requires a large workforce due to the extensive moving and assembly requirements of mounting the frame and attaching the associated solar cell modules. These prior designs did not allow for a single person or just a few persons to install the frame and solar cell modules.

These prior frames also provide for mounting a predetermined number of solar cell modules. There was no ability to modify the number of solar cell modules to accommodate the specific needs of the array. Particularly, there is no manner of modifying the design out in the field during or after the installation.

SUMMARY

The present application is directed to a terrestrial solar tracking photovoltaic array. The array may include a modular design that is sized and weighted to facilitate installation with a small amount of manpower. The array further is adapted to be adjusted during or after installation to accommodate the necessary power requirements.

The terrestrial solar tracking photovoltaic array includes a torque tube that may be constructed of discrete sections. A drive may be connected to the torque tube to rotate the torque tube. A number of solar cell modules may be connected to the torque tube. The modules may be positioned at offsetting angular orientations depending upon their distance away from the drive. This offset positioning compensates for twisting distortion of the torque tube caused by the drive rotating the torque tube. At one point of rotation, each of the solar cell modules may be substantially aligned in a common plane.

The various aspects of the various embodiments may be used alone or in any combination, as is desired.

DETAILED DESCRIPTION

Figure 1:
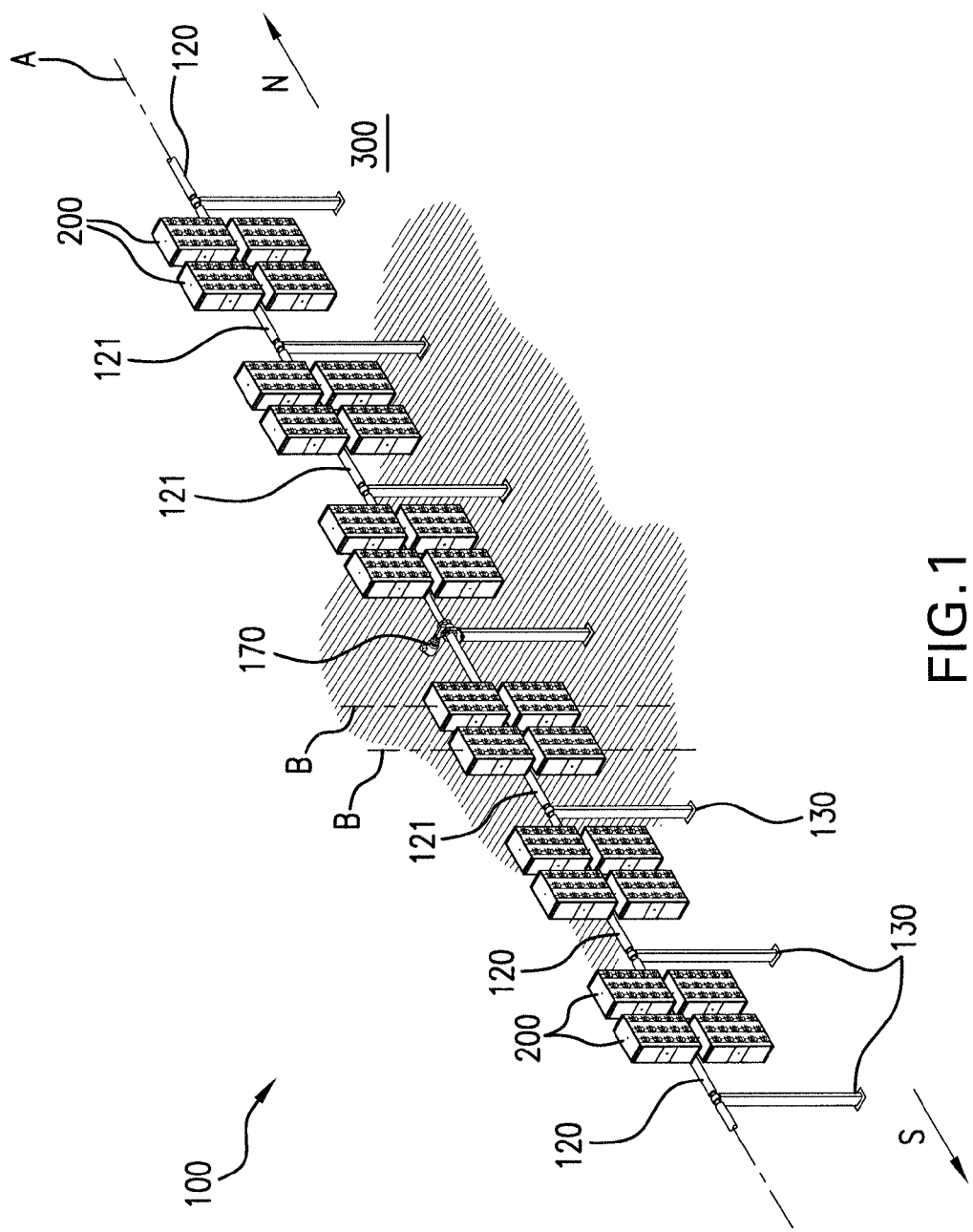
FIG. 1 is a perspective view of a terrestrial solar tracking photovoltaic array according to one embodiment.

The present application is directed to a terrestrial solar tracking photovoltaic array. FIG. 1 illustrates an embodiment of an array generally illustrated as element 100. The array 100 includes an elongated torque tube 120 configured to mount solar cell modules 200 in a longitudinally-extending and spaced-apart arrangement. A drive 170 is connected to the torque tube 120 to rotate the solar cell modules 200 about a first axis A for the solar cell modules 200 to track the elevation of the sun during the course of a day.

The torque tube 120 is positioned above a surface 300 by spaced-apart vertical supports 130. In one embodiment, the torque tube 120 is a single continuous piece. In one specific embodiment, the torque tube 120 is a pipe with a diameter of about 4-5.63 inches and includes a thickness of about 0.167-0.188 inches. The pipe has a length of about 170" and weighs about 110 lbs. The torque tube 120 may also be constructed from a number of discrete sections 121 that are connected together in an end-to-end arrangement. The lengths and construction of each section 121 may be the same or may be different. In one embodiment, each section 121 is sized to mount a pair or multiple pairs of solar cell array modules 200. The modular design provides for a user to construct the torque tube 120 to a length needed to support a necessary number of solar cell modules 200. Sections 121 may be added to an existing frame 110 to accommodate additional solar cell modules 200 as is necessary for the array 100 to produce the desired power output. The torque tube 120 may be constructed from various materials and combinations. The torque tube 120 may be hollow, or may be solid. In the solid embodiments, the torque tube 120 may be constructed as a single, unitary construction, or may include a first exterior material, and one or more different interior materials.

Figure 2:
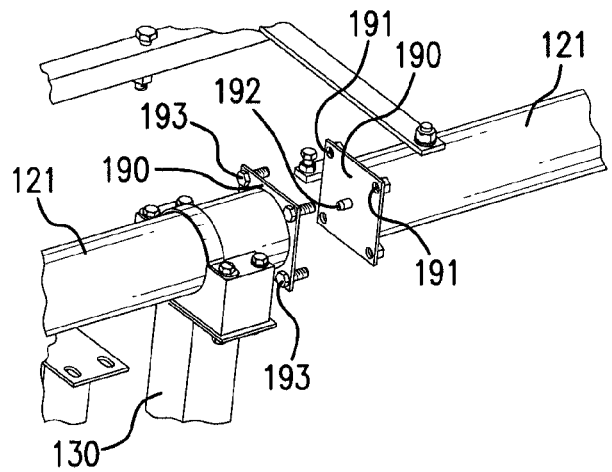
FIG. 2 is a perspective view from a first direction of a pair of sections separate apart according to one embodiment.
Figure 3:
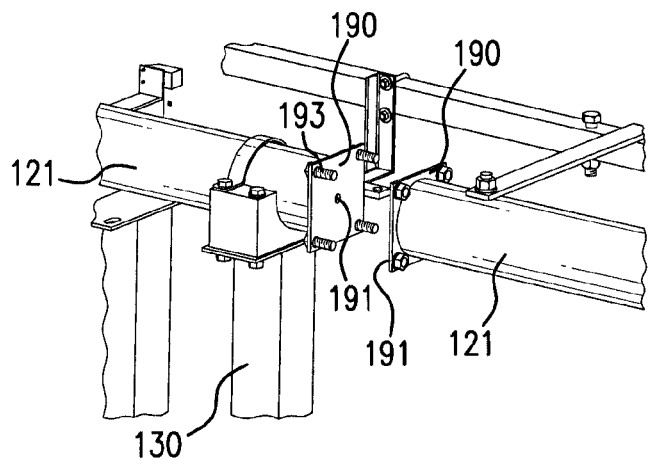
FIG. 3 is a perspective view from a second direction of a pair of sections separate apart according to one embodiment.
Figure 4:
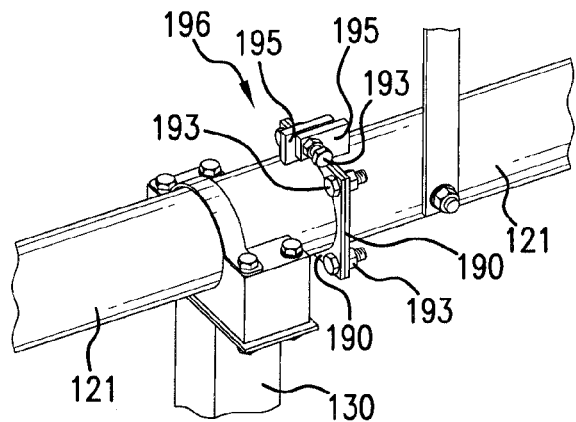
FIG. 4 is a perspective view of a pair of sections connected together according to one embodiment.

The sections 121 may be configured to securely connect together as illustrated in FIGS. 2, 3, and 4. Flanges 190 may be positioned at the ends of the sections 121 and include corresponding surfaces that abut together. The flanges 190 may be larger than the sections 121 with the outer edges of the flanges 190 extending outward beyond the sections 121. FIGS. 2-4 include the flanges 190 extending outward around the sections 121, although flanges 190 may also be shaped and sized to extend outward from a limited area of the sections 121. Apertures 191 may extend through the flanges 190 to receive fasteners 193 to connect the sections 121 together. The apertures 191 are preferably positioned away from the sections 121 to allow access to the fasteners 193.

A centering pin 192 may extend outward from the sections 121 and fit within an aperture 191 in an abutting flange 190. The centering pin 192 and corresponding aperture 191 are positioned along the longitudinal axis A and facilitate alignment of the different sections 121.

A torsion deflection adjustment mechanism 196 may be connected to the sections 121. The mechanism 196 may include plates 195 that abut together and are connected with a fastener 193. The enlarged contact area of the plates 195 reduces torsional deflection during rotation of the torque tube 120.

The drive 170 is connected to the torque tube 120 to provide a force to rotate the torque tube 120 about the longitudinal axis A. In one embodiment as illustrated in FIG. 1, the drive 170 is positioned within an intermediate point along the torque tube 120. In one specific embodiment, the drive 170 is positioned at the center of the torque tube 120 and between discrete sections 121. Other embodiments may include the drive 170 positioned at an end of the torque tube 120 or various other locations along the length. The drive 170 may include a drive train with one or more gears that engage with the torque tube 120. Additional drives 170 may be connected along the length of the torque tube 120 to provide additional rotational force.

When mounted on the surface 300, the torque tube 120 may be positioned in a north N-south S orientation as illustrated in FIG. 1. In one embodiment, the surface 300 is the surface of the Earth. Throughout the course of the day, the drive 170 rotates the torque tube 120 to maintain the solar cell modules 200 facing towards the sun. However, the torque applied by the drive 170 may cause the torque tube 120 to twist. The twisting distorts the torque tube 120 causing the different modules 200 spaced along the length to rotate different amount. This variation in rotation may cause one or more of the modules 200 to be out of alignment with the sun. Further, the amount of twist distortion increases over the length of the torque tube 120. Therefore, the amount of twisting distortion of the torque tube 120 in proximity to the drive 170 is smaller than the amount of twisting at a point farther away from the drive 170.

Figure 5A:
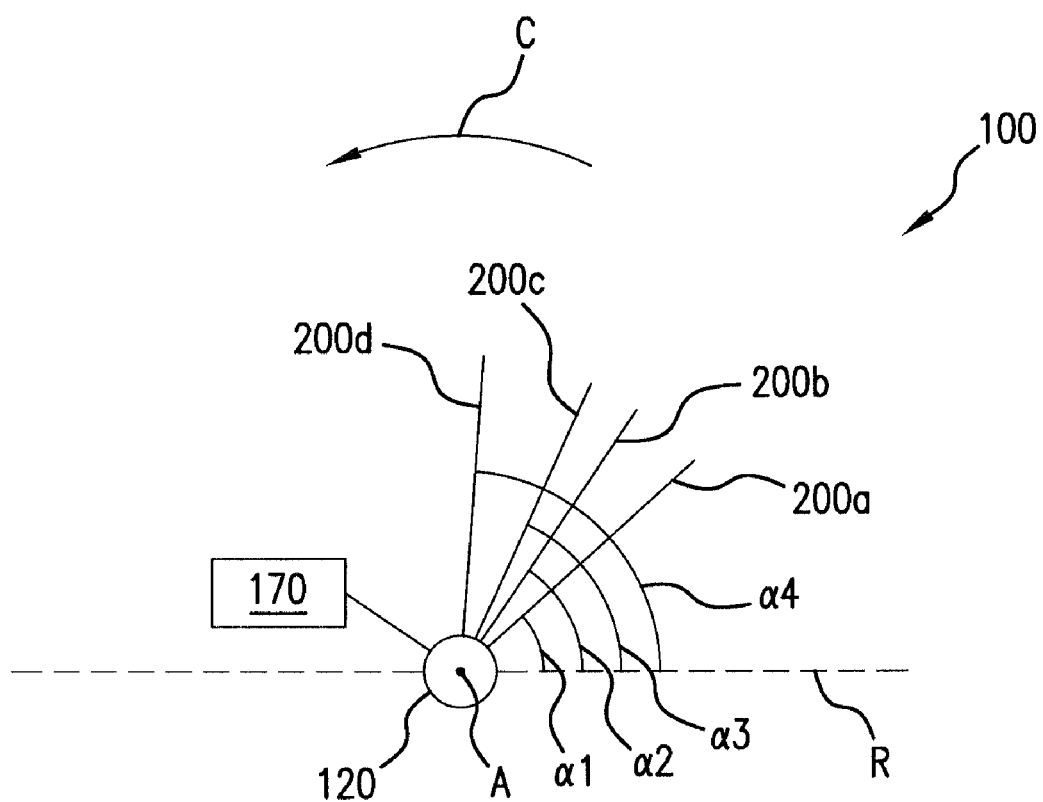
FIG. 5A is a schematic end view of a torque tube and solar cell modules at a first time of a day according to one embodiment.
Figure 5B:
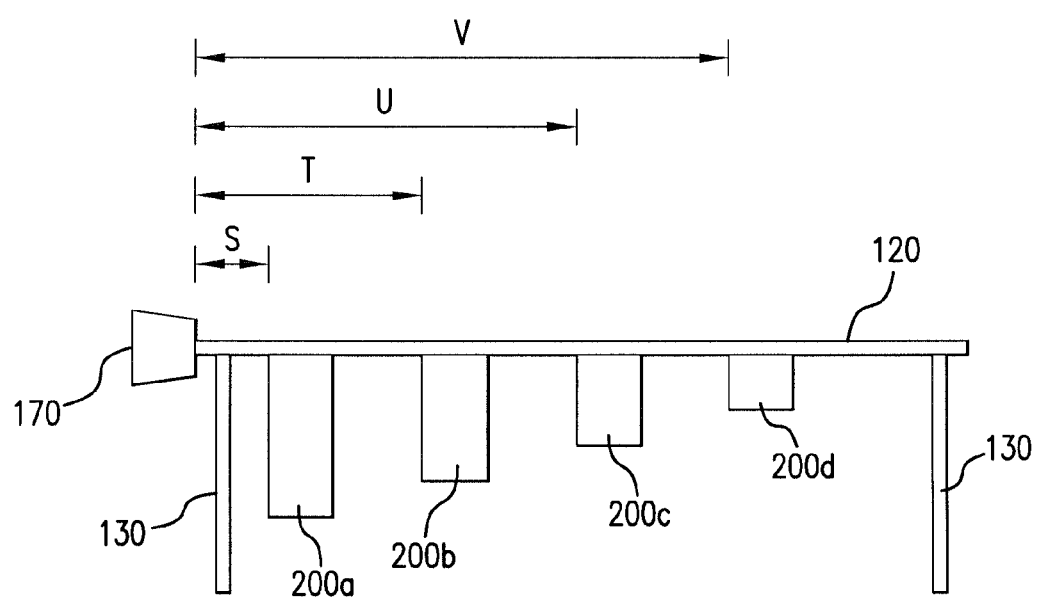
FIG. 5B is a side view of the torque tube and solar cell modules of FIG. 2A.

To compensate for the twisting distortion of the torque tube 120, the modules 200 spaced apart along the length of the torque tube 120 are oriented at different angular positions. FIG. 5A illustrates a schematic end view of the torque tube 120 that rotates about the longitudinal axis A in the direction of arrow C during the course of the day. FIG. 5B is a schematic side view of the torque tube 120 and modules 200. The drive 170 is operatively connected to and rotates the torque tube 120. A reference line R extends through and is perpendicular to the longitudinal axis A. In one embodiment, the reference R is parallel to the surface 300.

As illustrated in FIG. 5B, module 200a is positioned along the torque tube 120 a distance S that is closest to the drive 170. Module 200b is positioned a distance T which is second closest, module 200c positioned a distance U a third distance, and module 200d a distance V which is the farthest from the drive 170.

FIG. 5A illustrates an initial position of the modules 200 with response to the torque tube 120 at a time with the drive 170 applying no rotational force to the torque tube 120. The first module 200a is positioned at a first angle $\alpha 1$ with the module aligned in a first plane, module 200b at a second angle $\alpha 2$ and aligned in different second plane, module 200c at a third angle $\alpha 3$ and in a third plane, and module 200d at a fourth angle $\alpha 4$ and aligned in a fourth plane.

The size of the angle $\alpha$ is dependent upon the distance along the longitudinal axis A the module 200 is away from the drive 170. The farther the module is located away from the drive 170, the smaller the angle $\alpha$. This relationship results because the amount of deformation increases along the length and results in less rotation of the modules 200. In essence, the modules 200 in closer proximity to the drive 170 will rotate over a greater sweep range than the modules 200 positioned a greater distance away. Using the embodiment of FIGS. 5A and 5B as an example, the first module 200a located in closer proximity to the drive 170 is positioned at a lesser angle than the third module 200c. The first module 200a will rotate over a greater sweep during the course of the day than the third module 200c.

When the torque tube 120 is constructed from different discrete sections 121, the sections 121 may include the same or different materials, cross-sectional shape, size, and thickness. The different constructions and/or the connections between the discrete sections 121 may affect the size of the offset angle $\alpha$.

FIGS. 5A-8 illustrate the movement of the torque tube 120 and modules 200a-200d during a course of the day as they rotate in the direction indicated by arrow C. FIGS. 5A and 5B include an initial position of the array 100 prior to the drive 170 applying rotational force to the torque tube 120. As explained above, the modules 200a-d are offset at different rotational positions based on their distance away from the drive 170. At this initial position, each of the modules 200 is aligned in a different plane.

Figure 6:
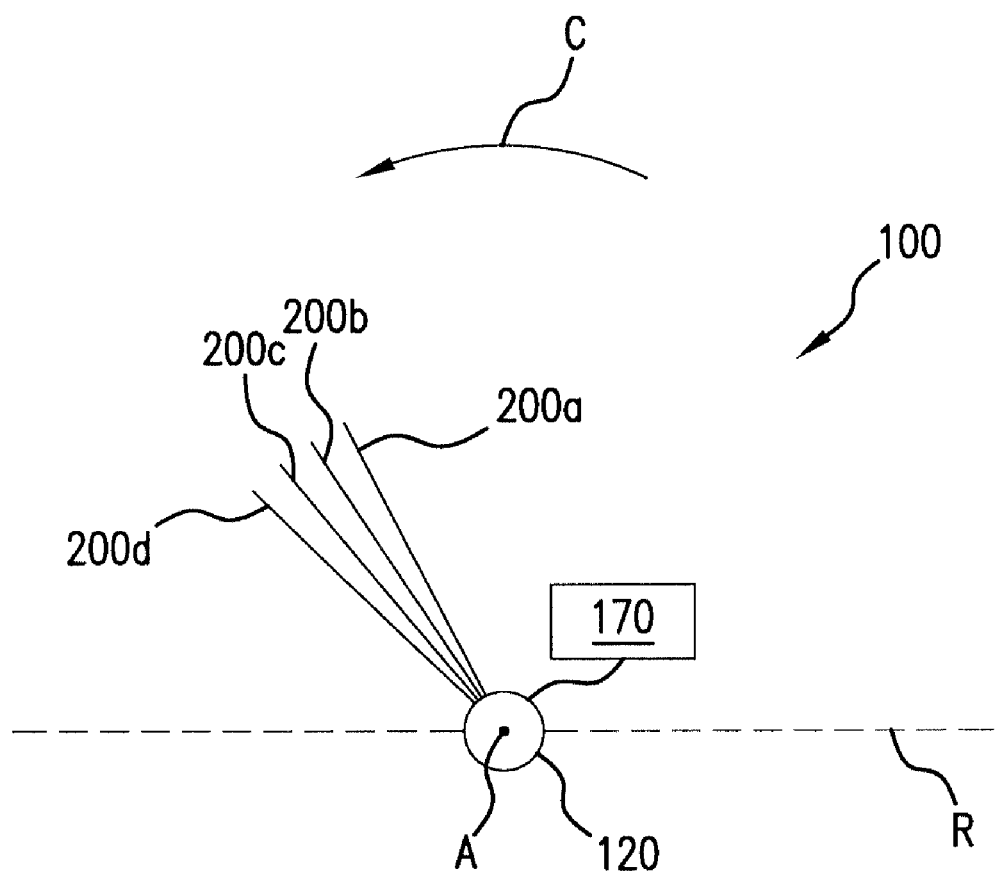
FIG. 6 is a schematic end view of a torque tube and solar cell modules at a second time of the day according to one embodiment.

FIG. 6 illustrates the array 100 at a later time during the day after the drive 170 has rotated the torque tube 120 an amount in the direction of arrow C. The rotation causes the modules 200a-d to remain aligned with the sun. Because of the deformation of the torque tube 120, the different modules 200a-d have experienced different amounts of rotation. Module 200a is the closest to the drive 170 and has moved through the greatest rotational sweep. Module 200b is the second closest to the drive 170 and has moved through the second greatest amount of rotation. Likewise, the amounts of rotation of the third and fourth modules 200c, 200d is progressively less. The modules 200 are each aligned in a different plane.

Figure 7:
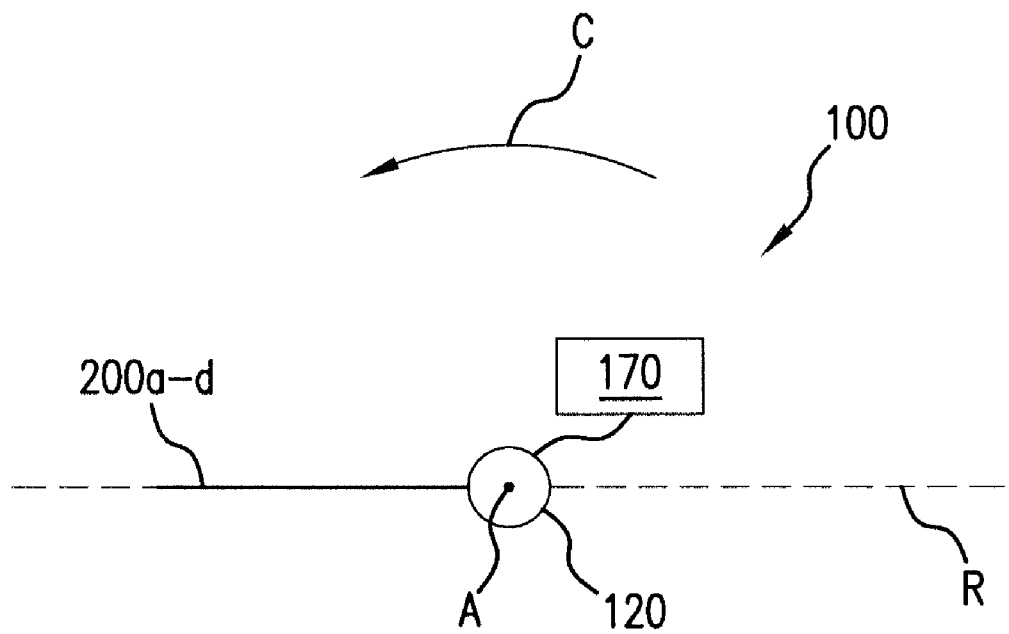
FIG. 7 is a schematic end view of a torque tube and solar cell modules at a third time of the day according to one embodiment.

FIG. 7 illustrates the array 100 at a still later time during the day. The drive 170 has rotated the torque tube 120 such that each of the modules 200a-d are substantially aligned in a single plane. In one embodiment, this alignment occurs at the peak sun intensity of the day. In one embodiment, a section of the torque tube 120 at the drive rotates through an angular range of about 90 degrees from the initial starting position to the rotational point where the solar cell modules 200 are aligned in a common plane.

Figure 8:
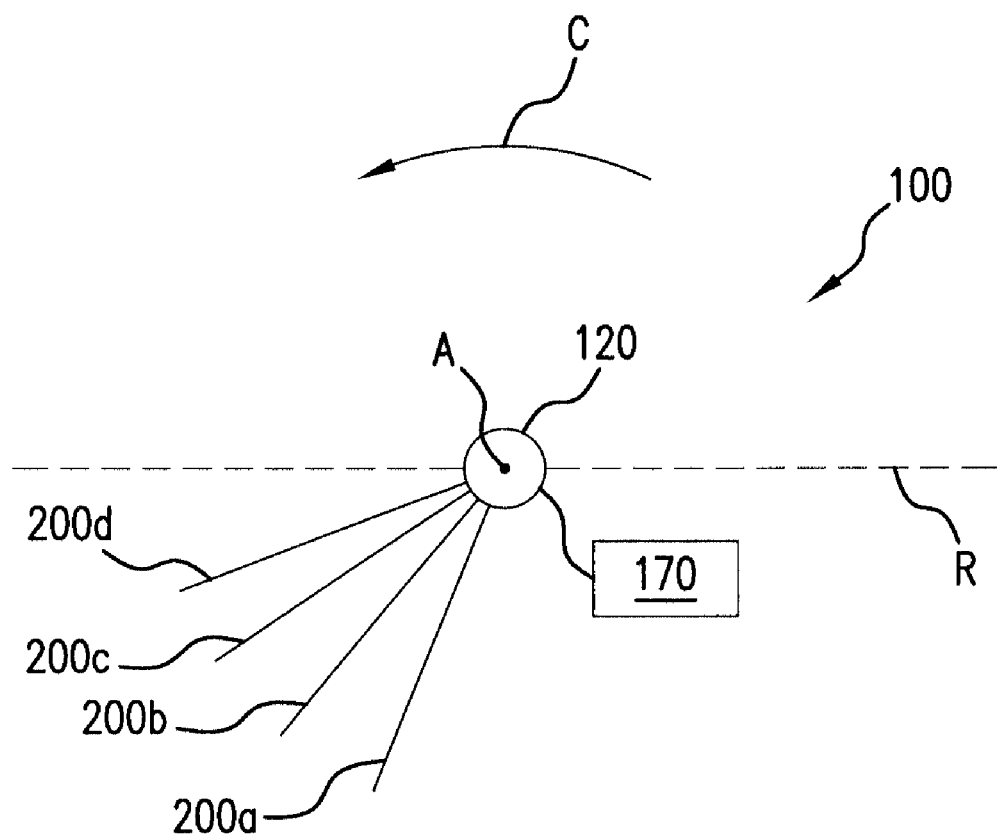
FIG. 8 is a schematic end view of a torque tube and solar cell modules at a fourth time of the day according to one embodiment.

FIG. 8 illustrates a later time than that of FIG. 7. The drive 170 has continued to rotate the torque tube 120. The first module 200a has rotated an amount to now lead the other modules 200b-200d. This is the opposite of the relative position of first module 200a which trailed the other modules 200b-d prior to the peak time illustrated in FIG. 7. The drive 170 rotates the torque tube 120 with the other modules 200b-200d rotating a less amount than module 200a. The modules 200 are again each aligned in a different plane at this time.

The embodiment of FIG. 7 includes a particular time at which each of the modules 200 are aligned in the same plane. Other embodiments may include no time at which each of the modules 200 are aligned in a common plane. Two or more of the modules 200 may be aligned at various times during the day.

Figure 9:
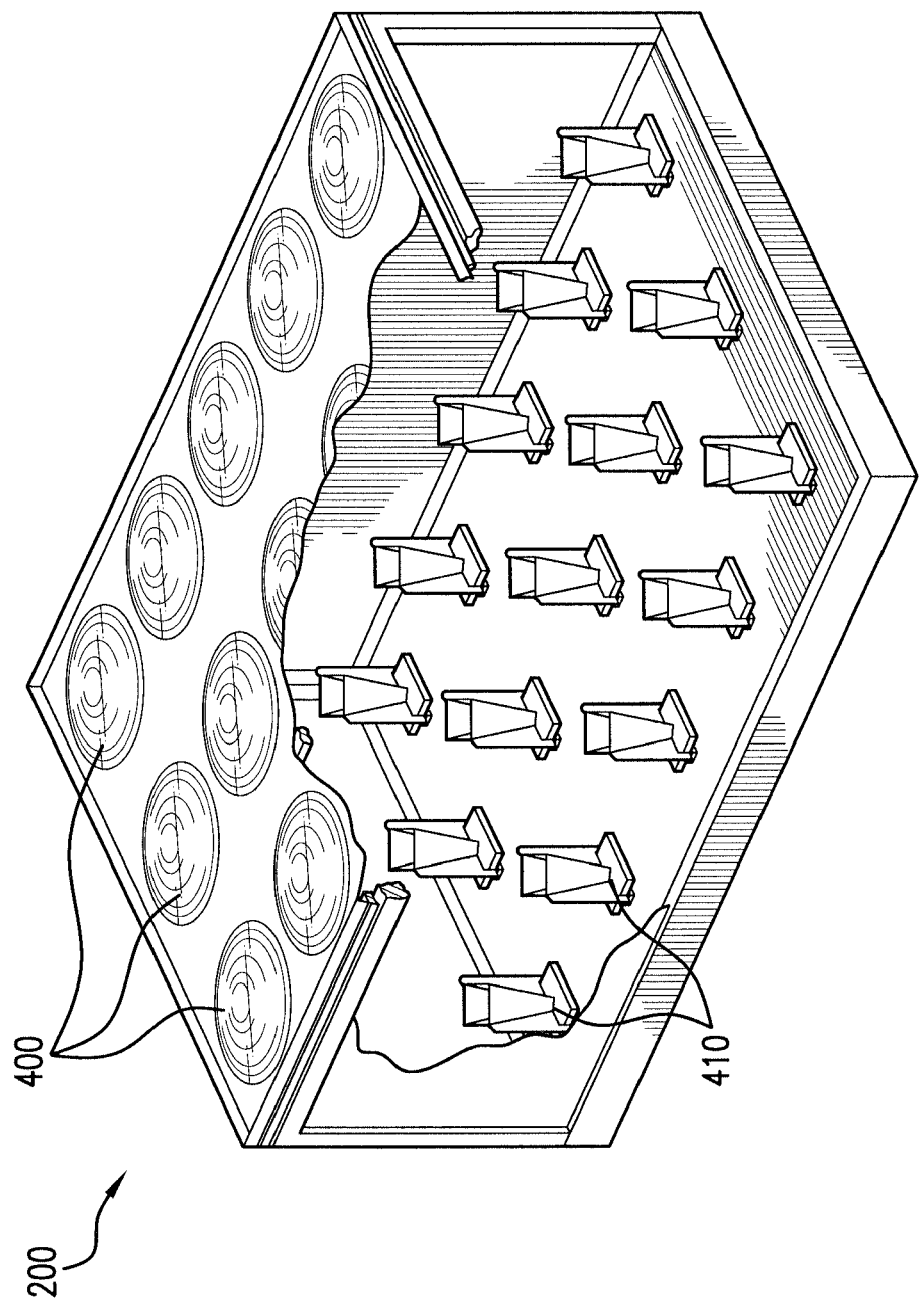
FIG. 9 is a perspective cut-away view of a solar cell array module according to one embodiment.
Figure 10:
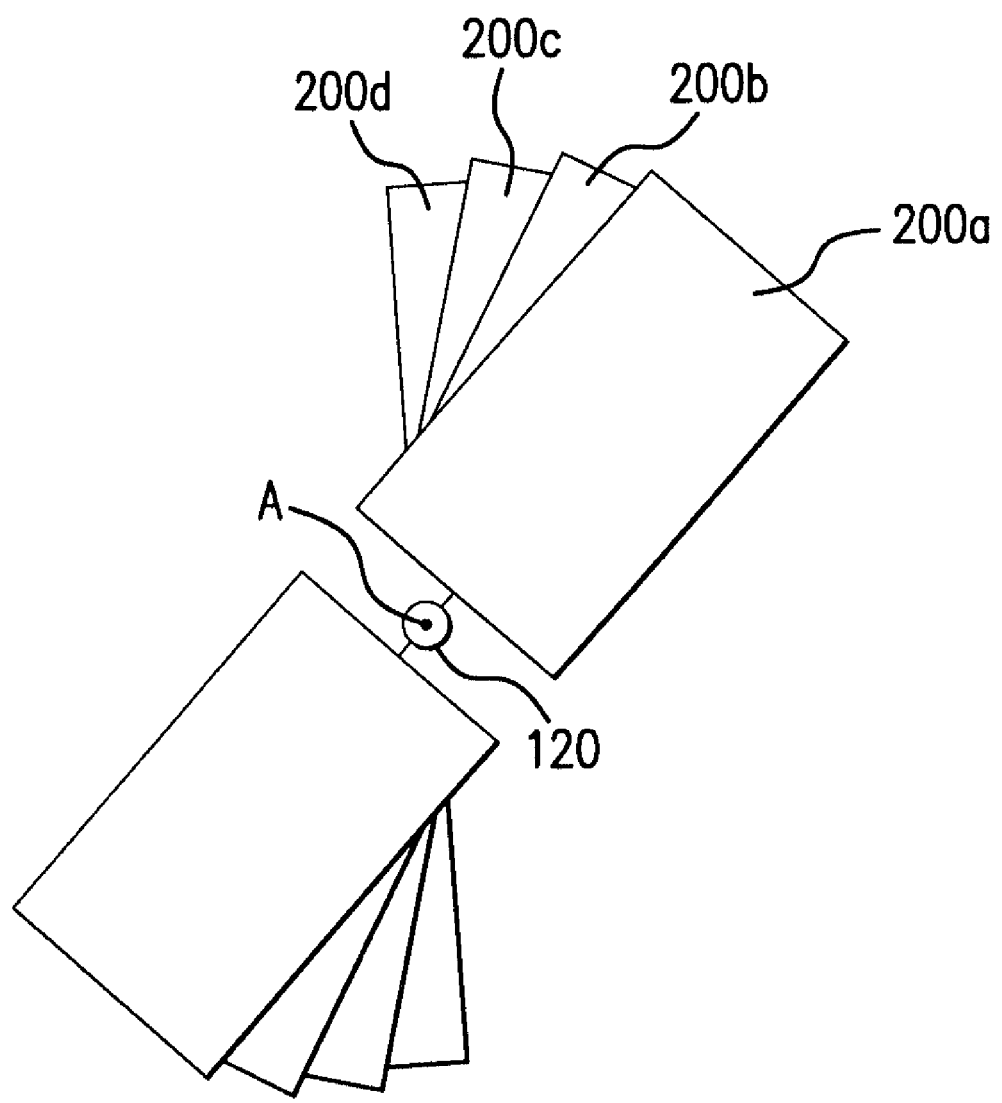
FIG. 10 is an end view of a torque tube and solar cell modules according to one embodiment.

FIG. 9 illustrates one embodiment of a solar cell module 200. In one embodiment, the solar cell modules 200 are each about 43" by 67". FIG. 9 illustrates an embodiment of a solar cell module 200 with an aluminum frame and plastic or corrugated plastic sides that reduce the overall weight to about 70 pounds. In one embodiment, each solar cell module 200 includes a 3×5 array of lenses 400 that are positioned over corresponding receivers 410. The lenses may include various shapes and sizes with one specific embodiment including lenses that are about 13" square. Further, the focal length between the lenses 400 and the receivers 410 is about 20". Each receiver 410 may include one or more III-V compound semiconductor solar cells.

The drive 170 rotates the torque tube in a first direction during the course of the day. Prior to the start of the next day, the drive rotates the torque tube 120 in the opposite direction. The rotation in the second direction prepares the array 100 for tracking the elevation of the sun during the following day. In one embodiment, the drive 170 takes only a short period of time (e.g., several minutes) to rotate the array in the second direction from the ending point to the starting point.

The modules 200 may be positioned at various spacings along the length of the torque tube 120. FIG. 1 includes the modules 200 aligned along the torque tube 120 in offsetting pairs on opposing sides of the torque tube 120 directly across from one another. Other offset positioning may include the modules 200 unevenly spread along the length of the torque tube 120 with equal numbers extending outward from each opposing side. The offset positioning assists to balance the array 100 and facilitate rotation about the first axis A. Other configurations may include uneven numbers of modules 200 extending outward from the opposing sides of the torque tube 120. FIGS. 5A-8 include single modules 200 spaced along the longitudinal length of the torque tube 120 and each extending outward in substantially the same direction. FIG. 9 includes paired modules 200a-d with modules on opposing sides of the torque tube 120.

In one embodiment illustrated in FIG. 1, the modules 200 are arranged in sets of four along the length of the length of the torque tube 120. The sets may be spaced apart along the length. A vertical support 130 may also be positioned between adjacent sets. Each of the modules 200 within a set may be positioned at the same angular offset. Using FIG. 1 as an example, the first set of modules 200 immediately to the right of the drive 170 are each offset at a first angular position. The next set of four modules that are spaced away from the first set may each be oriented at a different angular offset.

The vertical supports 130 are spaced apart along the length of the torque tube 120. The vertical supports 130 include a length adequate to position the solar cell modules 120 above the surface 300 for rotation about the first axis A. Therefore, the vertical supports 130 are longer than a height of the solar cell modules 200. In one specific embodiment, the vertical supports 130 include a 4 inch by 4 inch rectangular shape, and include a thickness of about 0.188 inches. The vertical supports 130 may also be supported in a concrete pad.

As also illustrated in FIG. 1, the modules 200 may also be connected to the torque tube to rotate along axes B that are substantially perpendicular to axis A to track the azimuthal position of the sun during the course of the day.

The shadow cast by a given solar cell module 200 depends on its size and shape, and also on its location relative to the location of the sun in the sky. In the East-West direction, the sun location can vary by up to 150°. In this connection, it should be noted that it is generally accepted that, where the elevation of the sun is below 15° above the horizon, its rays are of insufficient strength to generate a useful amount of electricity. The latitude at which the solar cell array 100 is positioned is, therefore, of little influence.

In the North-South direction, the sun location varies by 46°, given that the earth's axis is tilted at an angle of 23° with respect to its orbit around the sun. In this connection, it will be appreciated that latitudes below 23° are subject to different conditions, and that latitudes above 45° are probably not relevant due to poor direct normal insolation (DNI) levels.

The solar cell array 100 is constructed in a manner to eliminate or minimize shadowing problems between solar cell modules 200. In one embodiment, the torque tube 120 and the individual sections 121 of the solar cell modules 200 are sized to space apart each module 200 such that it is fully illuminated for positions where the sun is 15° above the horizon, and that there is no shadowing of any given module 200 by any other module 200.

In one embodiment, the terrestrial solar tracking array 100 can be installed in a straight-forward manner. The various components are sized to fit within a standard vehicle and are light-weight to allow installation by a single person or limited number of persons. Further, the modular aspect of the array 100 facilitates modifications after the initial installation. Additional sections 121 and vertical supports 130 may be added to the frame 110 to accommodate a desired number of additional solar cell modules 200. The distance the added modules 200 will be spaced away from the drive 170 is calculated and the appropriate angular offset is determined for positioned the modules 200 relative to the torque tube 120. Further, the size of the array 100 may be reduced after installation by removing one or more solar cell modules 200.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the scope of this invention. Furthermore, it is to be understood that the invention is solely defined by the appended claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A terrestrial solar tracking photovoltaic array comprising:
   an elongated torque tube;
   two or more sets of solar cell modules connected to the torque tube and being aligned in different planes that are angularly offset relative to one another;
   a drive to rotate the torque tube about a longitudinal axis of the torque tube to move each of the sets of solar cell modules to track the sun during the course of a day;
   each of the sets of solar cell modules being spaced different distances away from the drive with the angular offsets between the sets being a function of the distance away from the drive to compensate for differences in twisting distortion of the torque tube along the length of the torque tube when the drive rotates the torque tube;
   each of the sets of solar cell modules being substantially aligned in a common plane after a predetermined amount of rotation of the torque tube.

2. The array of claim 1, further comprising a plurality of vertical supports positioned along the torque tube to support the torque tube an the solar cell modules above the earth, each of the sets of solar cell modules being separated along the length of the torque tube by one of the plurality of vertical supports.

3. The array of claim 1, wherein the torque tube includes a plurality of discrete sections that are connected together in an end-to-end arrangement.

4. The array of claim 3, wherein the drive is positioned between the two of the discrete sections.

5. The array of claim 3, further comprising an enlarged flange positioned at ends of each of the discrete sections, the flanges including larger areas than the discrete sections and being abutted together when the sections are connected together.

6. The array of claim 5, further comprising an torsion deflection mechanism attached to the exterior of the torque tube and extending between two of the discrete sections.

7. The array of claim 1, wherein each set of solar cell modules includes four separate solar cell modules with a first pair of the solar cell modules positioned on a first side of the torque tube and a second pair of the solar cell modules positioned on a second side of the torque tube.

8. The array of claim 1, wherein each of the sets of solar cell modules being connected to the torque tube to rotate about a second axis perpendicular to the longitudinal axis of the torque tube.

9. The array of claim 1, wherein each of the sets of solar cell modules extend perpendicularly outward from the torque tube.

10. The array of claim 1, wherein the torque tube includes a pipe with a diameter of about 4 inches and a length of about 192 inches.

11. A terrestrial solar tracking photovoltaic array comprising:
    an elongated torque tube;
    a plurality of solar cell modules connected to the torque tube and being aligned in different planes that are angularly offset relative to one another;
    a drive connected to the torque tube to rotate the torque tube about a longitudinal axis of the torque tube to move each of the plurality of solar cell modules;
    each of the plurality of solar cell modules being spaced different distances away from the drive with the angular offsets between each of the plurality of solar cell modules being a function of the distance away from the drive to compensate for twisting distortion of the torque tube caused by the drive rotating the torque tube;
    each of the plurality of solar cell modules being substantially aligned in a common plane after the drive rotates the torque tube a predetermined amount.

12. The array of claim 11, wherein the plurality of solar cell modules are aligned in corresponding pairs with a first solar cell module aligned on a first side of the torque tube and a second solar cell module aligned on an opposing second side of the torque tube to balance the array.

13. The array of claim 12, wherein the plurality of solar cell modules are arranged in sets of four with each of the sets being spaced apart along the length of the torque tube.

14. The array of claim 11, wherein the torque tube includes a plurality of discrete sections and the drive is connected to the torque tube at a connection between two of the discrete sections.

15. The array of claim 11, wherein each of the plurality of solar cell modules includes a rectangular frame with a series of lenses spaced away from corresponding III-V compound semiconductor solar cells.

16. A terrestrial solar tracking photovoltaic array comprising:
    an elongated torque tube supported above the earth by a plurality of spaced-apart vertical supports;
    a plurality of solar cell modules connected to the torque tube and longitudinally spaced along the torque tube at different longitudinal spacings;
    a drive connected to the elongated torque tube to rotate the torque tube about a longitudinal axis of torque tube to move each of the solar cell modules to track the sun during the course of a day;
    each of the plurality of solar cell modules having a predetermined angular orientation determined as a function of the distances of the solar cell module from the drive to compensate for differences in twisting distortion when the drive rotates the torque tube.

17. A method of tracking the sun with a terrestrial solar tracking photovoltaic array comprising:
    applying a rotational force to a torque tube that includes a plurality of solar cell modules spaced apart along the torque tube and oriented in different planes when the torque tube is in an initial rotational angular position;
    rotating the torque tube and tracking the sun with the plurality of solar cell modules;
    distorting the torque tube while applying the rotational force and rotating the torque tube;

rotating the torque tube to a predetermined rotational angular position with each of the plurality of solar cell modules moving through a different angular sweep range as the torque tube rotates from the initial rotational angular position to the predetermined rotational angular position; and aligning the plurality of solar cell modules in a single plane at the predetermined rotational angular position.

18. The method of claim 17, further comprising aligning the plurality of solar cell modules at a peak sun intensity during the day.

19. The method of claim 17, further comprising rotating a first of the plurality of solar cell modules located in proximity to a drive through a smaller angular sweep range than a second of the plurality of solar cell modules located farther from the drive.

20. The method of claim 17, further comprising rotating a section of the torque tube operatively connected to a drive through an angular range of about 90 degrees from the initial rotational angular position to the predetermined rotational angular position.

21. A method of tracking the sun with a terrestrial solar tracking photovoltaic array comprising:

applying a rotational force to a torque tube that includes a first set of solar cell modules spaced a first distance from a drive and a second set of solar cell modules spaced a greater second distance from the drive, each of the first set of solar cell modules oriented in a common plane different than the second set of solar cell modules when the torque tube is in an initial rotational angular position;

rotating the torque tube from the initial rotational angular position to a predetermined angular position and tracking the sun with the first and second sets of solar cell modules during the day; and distorting the torque tube while rotating the torque tube from the initial rotational angular position to the predetermined angular position and rotating the first set of solar cell modules through a greater angular sweep range than the second set of solar cell modules.

22. The method of claim 21, further comprising aligning the first and second sets of solar cell modules in a common plane at the predetermined angular position.

* * * * *